United States Patent [19]

Rath

[11] Patent Number: 5,057,778
[45] Date of Patent: Oct. 15, 1991

[54] DOUBLE TUNED NMR COILS

[75] Inventor: Alan R. Rath, Fremont, Calif.

[73] Assignee: Spectroscopy Imaging Systems Corporation, Fremont, Calif.

[21] Appl. No.: 501,681

[22] Filed: Mar. 29, 1990

[51] Int. Cl.⁵ ............................................. G01R 33/20
[52] U.S. Cl. ..................................... 324/322; 324/318
[58] Field of Search ............... 324/300, 307, 309, 318, 324/319, 320, 322; 128/653 A

[56] References Cited

U.S. PATENT DOCUMENTS

| | | | |
|---|---|---|---|
| 4,721,914 | 1/1988 | Fukushima et al. | 324/320 |
| 4,916,398 | 4/1990 | Rath | 324/322 |
| 4,916,418 | 4/1990 | Rath | 324/318 |

Primary Examiner—Michael J. Tokar
Attorney, Agent, or Firm—Edward H. Berkowitz

[57] ABSTRACT

A double-tuned dual port segmented coil for NMR studies of a volume distributed sample is obtained by coupling corresponding junctions of respective segments of two segmented loop portions with legs comprising $L_xC_xL_x$ series combination. Four segment coil portions so coupled support two isolated input ports across $C_x$ for adjacent such legs.

3 Claims, 6 Drawing Sheets

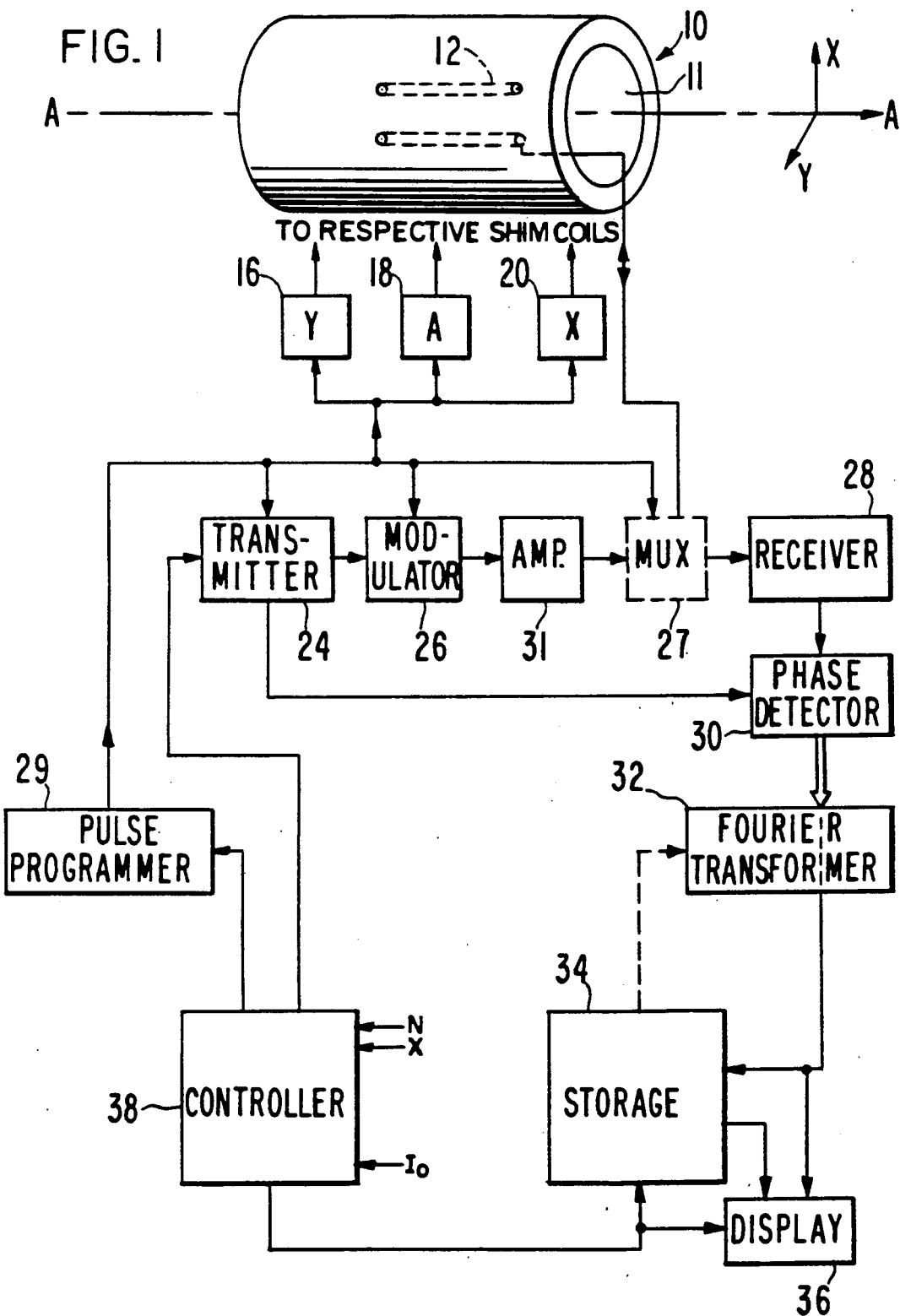

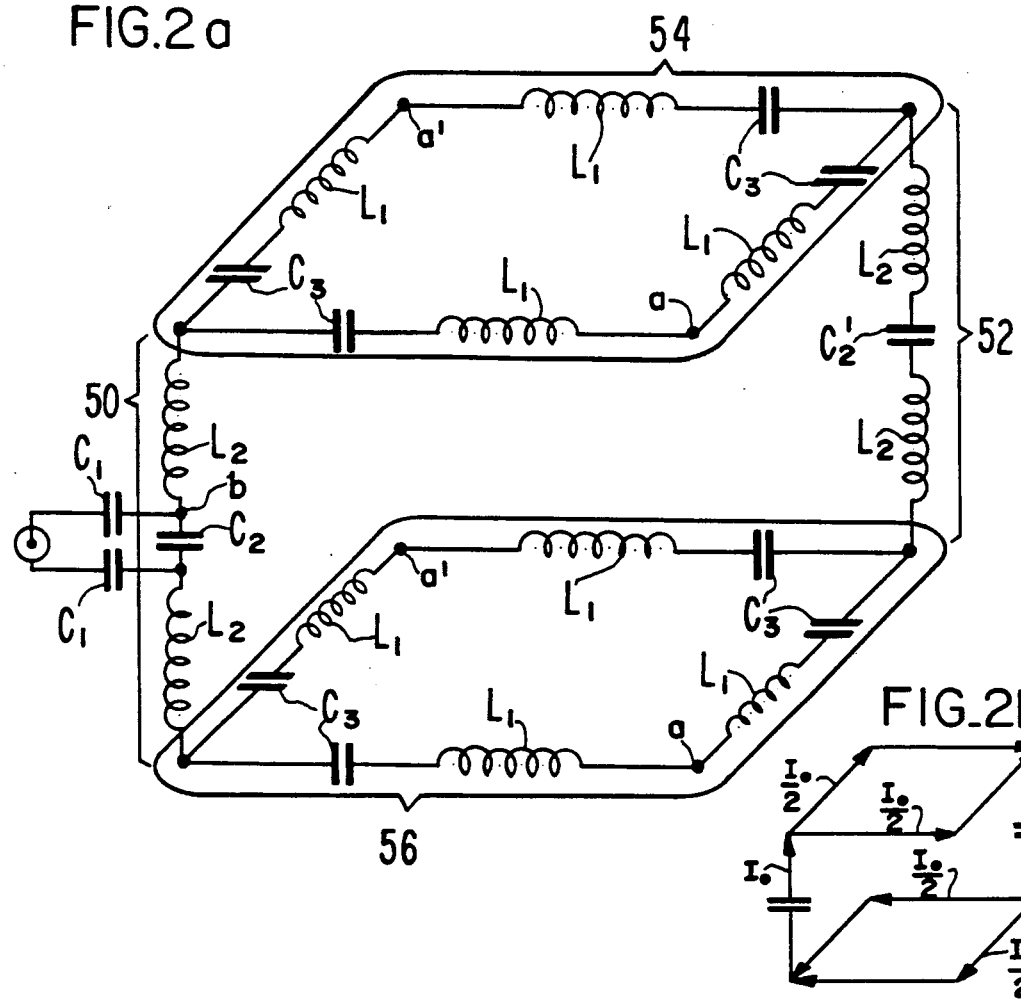
FIG.2a
FIG.2b
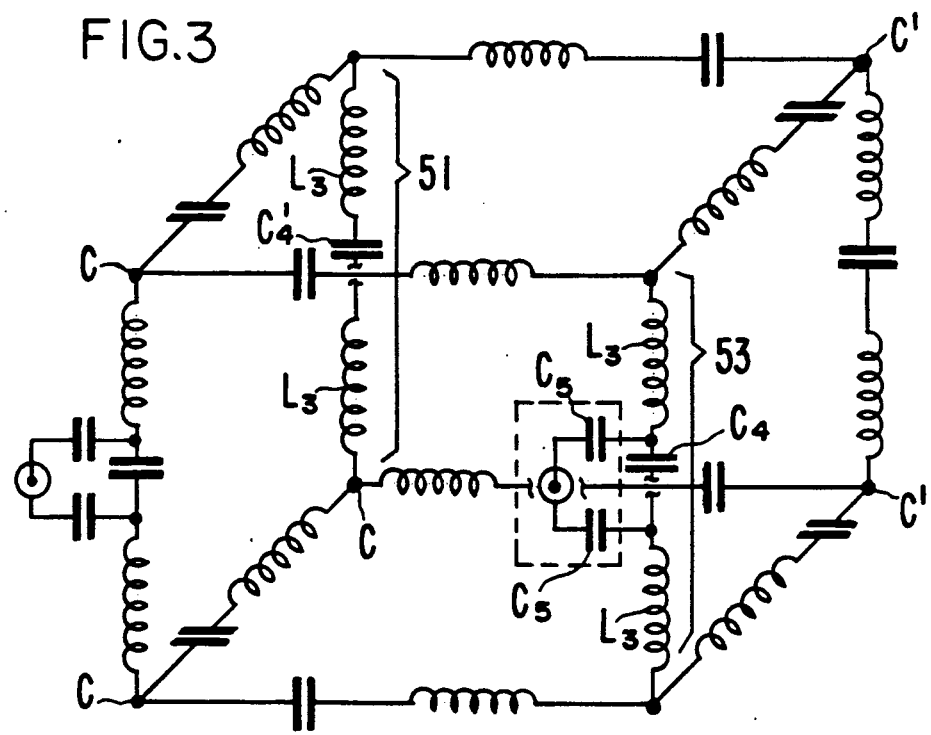
FIG.3

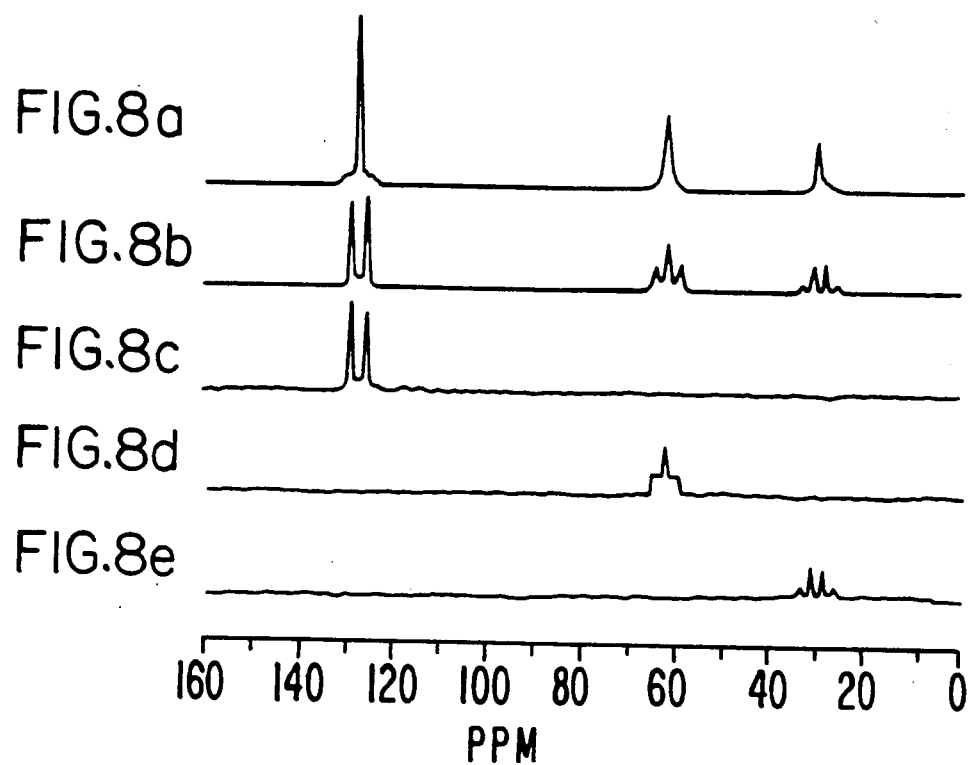
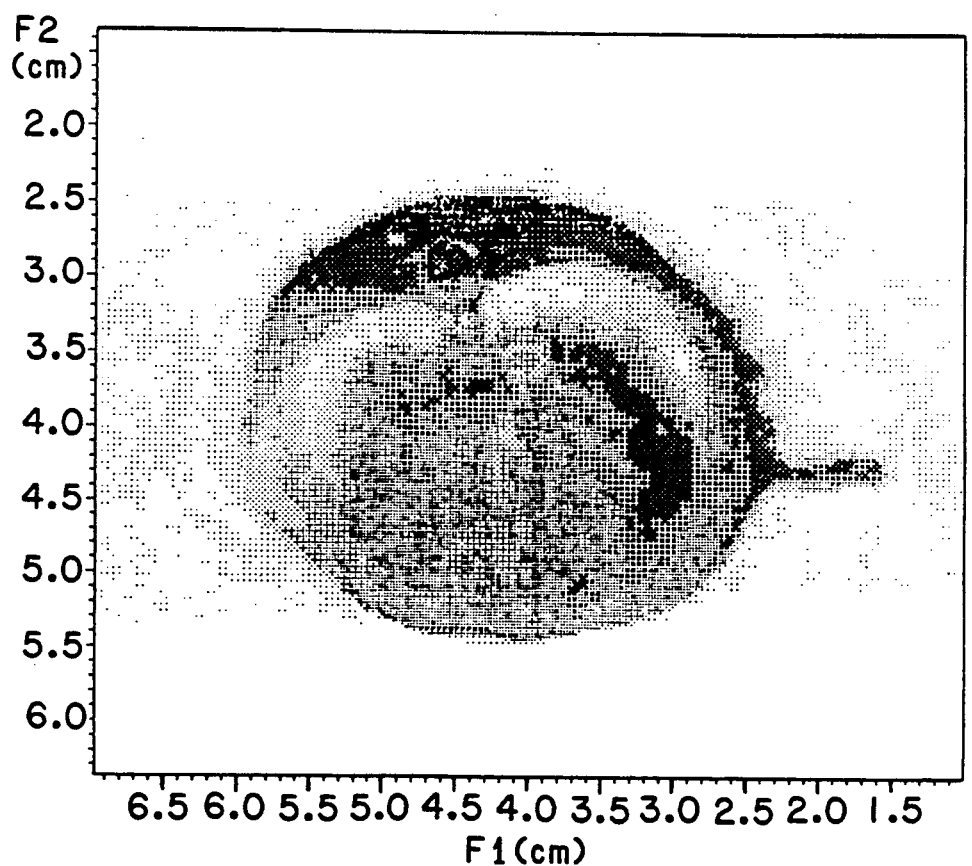

DOUBLE TUNED NMR COILS

Field of the Invention

The invention is in the area of NMR probe circuits and particularly such probe circuits exhibiting multiple-tuned response.

Background of the Invention

In the area of nuclear magnetic resonance, the need for apparatus equally sensitive to non-adjacent spectral regions is encountered in several contexts. One common example occurs where a sample is irradiated at some (high) frequency for one purpose while the same sample is concurrently irradiated at another (low) frequency for some other purpose. This is typical of a decoupling experiment wherein, for example, $C^{13}$-hydrogen couplings are disturbed while separately exciting the $C^{13}$ resonance concurrently.

One variation of such a double-tuned arrangement is the need for excitation and observation of chemically distinct samples where one such sample is a control employed for instrumental purposes such as the establishment of a field frequency lock, while the second sample is under study. One example of this arrangement is to be found in U.S. Pat. No. 3,434,043, commonly assigned. Another similar circumstance is the desire to concurrently excite selected different nuclei for acquisition of corresponding spectral response.

A double-tuned circuit ordinarily utilizes a single inductor common to two resonant circuits. Each sub-circuit in such an arrangement is separately tuned and impedance matched to its respective rf source (or sink). In one class of double-tuned arrangement it is necessary for an isolation element to be inserted between high frequency and low frequency sub-circuits, if it is required to achieve concurrent excitation at the respective frequencies. If it is sufficient to apply rf energy at different frequencies non-concurrently, there need be no isolation element. This is often the case where separate observations are to be made and it is desirable to avoid a re-tuning procedure or disturbance of the subject/sample. Moreover, the necessity for plural, isolated ports may be less for resonance observation than is the case for resonance excitation. This is the case where for, say, two resonances of substantially different magnitude, a single port matched to the weaker resonance will attenuate the stronger resonance. If such attenuation of one resonance is not desired, it may be preferable to have the benefit of multiple, isolated ports.

Double-tuned circuits are known which employ a transmission line of length $\lambda/4$ (at the high frequency) to provide such isolation. For an example of such an arrangement see Stoll, Vega, and Vaughan, Rev. Sci. Inst., V. 48, pp. 800–803 (1977).

A combination of $\frac{1}{2}\lambda$ transmission lines has been used to provide a double-tuned arrangement for frequencies in a ratio of a power of two to form a series arrangement of separate inductors at a low frequency and a parallel arrangement of the same inductors at a high frequency. This work is discussed in U.S.S.N. 477,687, commonly assigned.

Inductive elements in rf probe circuits are known to include "split inductors" such as taught in the work of Alderman and Grant, J. Mag. Res., V. 36, pp. 441–451 (1979) and Cook and Lowe, J. Mag. Res., V. 49, p. 346 (1982).

Balanced circuits exhibiting electrical symmetry are also known for the purpose of supporting double-tuned apparatus. Such circuits, exhibit among other properties, the virtue that a symmetry plane (or other surface) is defined which has a property of electrical neutrality, which is to say, a virtual ground.

An example of a balanced double-tuned circuit with split inductors and capacitances for NMR observe coils is to be found in U.S. Pat. No. 4,833,412. A double-tuned balanced circuit using lumped elements for a birdcage geometry is described in U.S.S.N. 331,935 commonly assigned herewith.

Brief Description of the Figures

FIG. 1 illustrates the context of the invention.

FIG. 2a is a prior art circuit.

FIG. 2b illustrates the currents of interest for the FIG. 2A circuit.

FIG. 3 is a double tuned (dual channel) resonant circuit of the present invention.

FIG. 4b shows the isolation obtained between driven legs A and B of the example of FIG. 4a.

FIG. 8a is the decoupled chemical shift spectrum of the phantom of FIG. 7.

FIG. 8b is the coupled spectrum corresponding to FIG. 8a.

FIGS. 8c, 8d and 8e are the spatially discriminate spectra of each of the respective three components of the phantom.

FIG. 9a is a proton image of a section through a live rat.

FIG. 9b is a sodium image obtained concurrently with FIG. 9a.

Detailed Description of the Invention

Figure 4A:
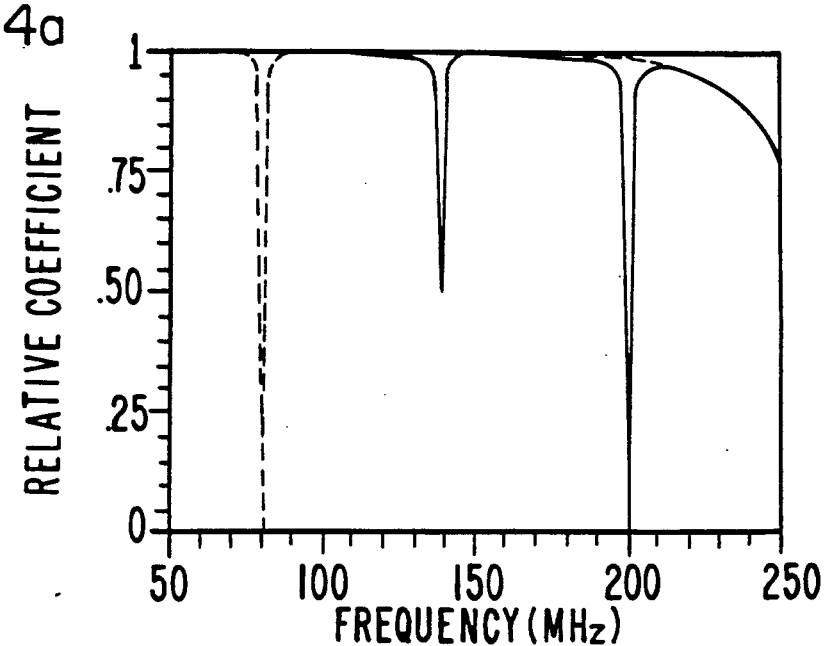
FIG. 4a shows the reflection co-efficient at driven legs A and B for one example circuit of FIG. 3.

Portions of a typical NMR data acquisition instrument are schematically illustrated on FIG. 1. An acquisition/control processor 10 communicates with an rf transmitter 12, modulator 14 and receiver 16, including analog-to-digital converter 18 and a further processor 20. The modulated rf power irradiates an object (not shown) in a magnetic field 21 through a probe assembly 22 and the response of the object is intercepted by probe 22 communicating with receiver 16. The response typically takes the form of a transient oscillatory signal, or free induction decay. This transient waveform is sampled at regular intervals and samples are digitized in ADC 18. The digitized time domain waveform is then subject to further processing in processor 20. The nature of such processing may include averaging a time domain waveform with a number of nominally identical such waveforms, and transformation of the average time domain waveform to the frequency domain yields a spectral distribution function directed to output device 24. The latter may take on any of a number of identities for the display of further analysis and data.

The magnetic field 21 which polarizes a sample is established by an appropriate means indicated in FIG. 1 such as cryostat 23 for the establishment and maintenance of a superconducting phase in a solenoid, not shown. The cryostat comprises a bore 23A in which the probe and sample are housed at room temperature.

The present invention is best understood in view of the prior art balanced coil structure illustrated in FIGS. 2a and 2b. Across the capacitance $c_2$ let there be a voltage drove 2V. Treating capacitor $c_2$ as defining a neutral plane, the potential at the $1_2 c_2$ junction above and below $c_2$ yields potential values $= V_1$ and $-V_1$, respectively. Consider coil portion 54; components of the circuit may be selected to support a potential $V_1$ between points b and a (and by symmetry between b and a') such that there will be no potential drop instantaneously between point a in closed loop coil portion 54 and point a in corresponding portion 56 (and by symmetry between corresponding point a'). A conductor placed between the two points a, and similarly between the two points a' will therefore not alter the current distribution of FIG. 2b.

The voltage drop across capacitor $c_2$ may be shown to be $$V_{c2} = (4Z_{12} + 2Z_{11} + 2Z_{c3} + Z_{c2'}) I_0/2 \qquad \text{Equ. 1}$$

where Z stands for the impedance of the subscripted component. The voltage drop from b to a is $$V_{ba} = I_0(Z_{12}) + I_0(Z_{c3} + Z_{11})/2 \qquad \text{Equ. 2}$$

Requiring the potential at point a to vanish one obtains $$2Z_{12} + Z_{11} + Z_{c3} Z_{c2'} = 0 \qquad \text{Equ. 3}$$

For given values of $l_1$ and $l_2$, capacitance values $C_{2'}$ and $C_3$ may be selected in accord with equation 3 whereby the potential at junction points a may be varied and likewise for points a' to yield the desired condition of zero potential drop therebetween.

Figure 4B:
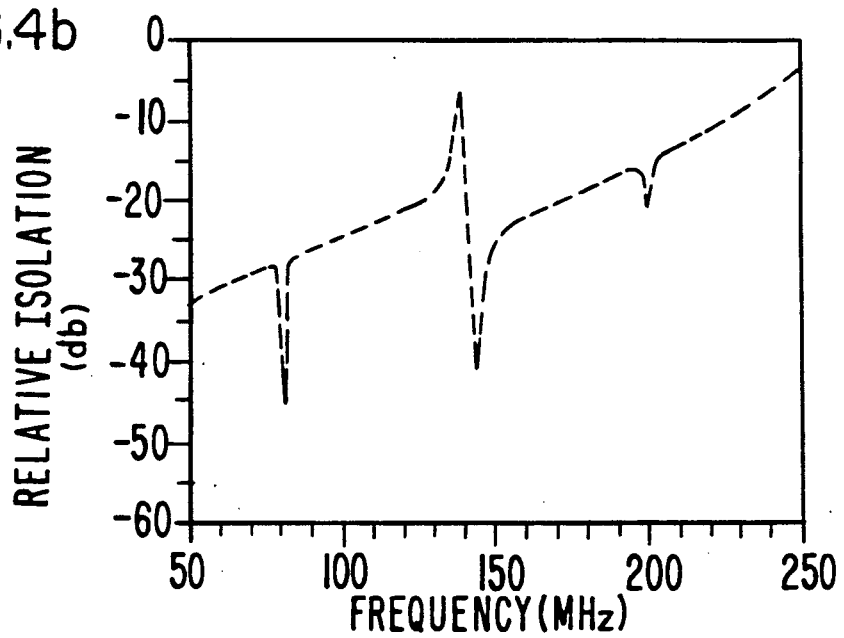

The circuit of FIG. 3 provides a second driven leg by addition of leg 53 comprising $l_3$-$c_4$-$l_3$ and the leg 51 comprising $l_3$-$c_4'$-$l_3$ with an input impedance matched through capacitances $c_5$ across $C_4$. the magnitude of the latter elements are derivable in straightforward fashion from the analysis outlined above where it is now further required that zero potential be established between junction points c and also between points c' in analogy to the above analysis. The theoretical performance of this circuit is shown in FIGS. 4a and 4b as parameterized by reflection co-efficient and relative isolation between ports, both as a function of frequency. The dotted line expresses the response to excitation applied at the low frequency port and the solid line shows the response to the excitation applied at the high frequency port (4a).

Figure 5:
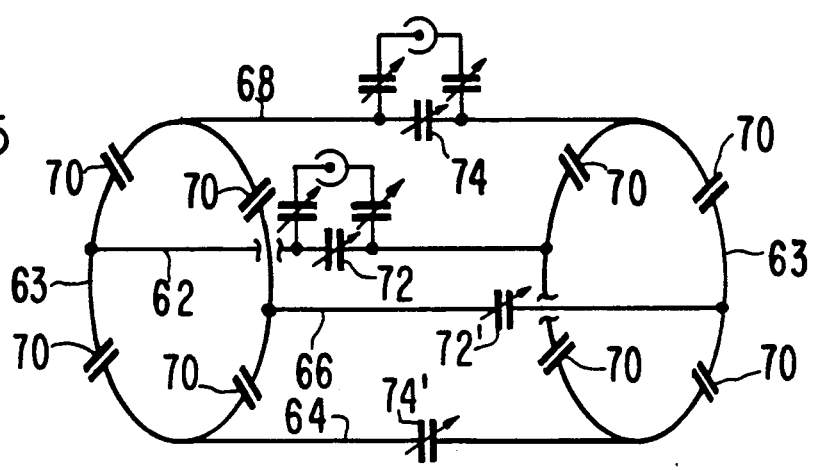
FIG. 5 is a perspective of an experimental prototype of the present double-tuned coil.

FIG. 5 shows (schematically) a realization of this embodiment. A four inch o.d. cylindrical acrylic coil former (not shown) supports four conducting legs 62, 64, 66 and 68 comprised of adhesive backed copper sheet disposed on the coil former. Physically each of these legs exhibits an angular width of about 40° with approximately 50° therebetween. This coil was driven from the electrical mid-points of two adjacent legs 62 and 68 at 50 and 200 MHz respectively. Capacitances 70 in the annular portion 63 of the structure correspond to capacitances $c_3$ and capacitances 72 and 72' in the longitudinal portions correspond to capacitances $c_2$ and $C_2'$ of FIGS. 2a and 3. At the frequencies of interest the longitudinal conducting members furnish inductances $L_1$ while the conductors linking capacitances 70 furnish the inductances $L_2$.

Figure 6A:
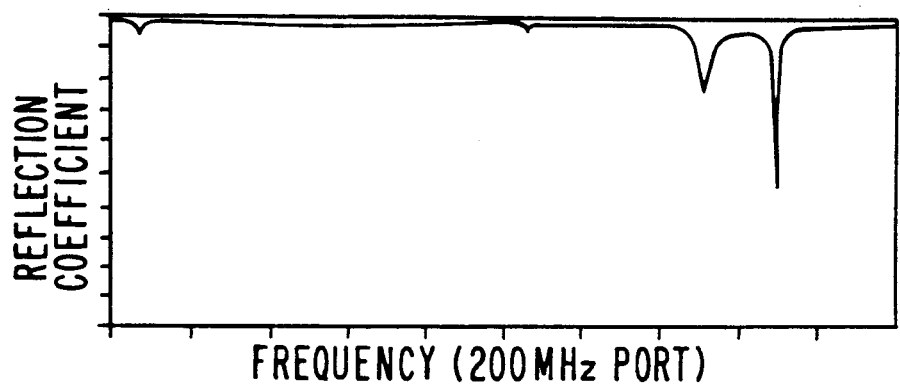
FIGS. 6a and 6b shows the return loss at respectively, the 50 and 200 MHz ports.
Figure 6B:
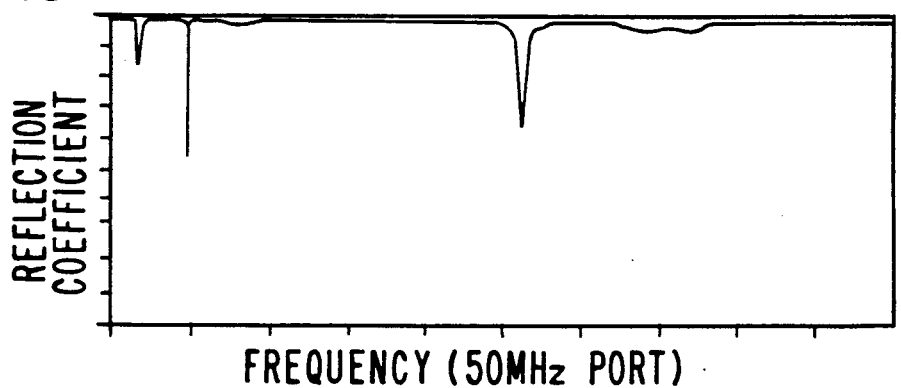

In FIG. 6a there is shown a reflection co-efficient $\rho$ measured at the 200 MHz port, for application at the 200 MHz port of rf energy over the range from 30 to 230 MHz. In like manner, FIG. 6b shows the reflection co-efficient behavior at the 50 MHz port for application of rf energy in the same range at the 50 MHz port. In achieving these results, the circuit of FIG. 4, as realized in the structure of FIG. 5 required minor additional modification. The capacitances realized by the gaps 70 were bypassed in order to tune the 50 MHz resonance using a reasonable value for a tuning capacitor $c_4$.

At 200 MHz the isolation between ports is about 48 db. Thus, for continuous decoupling at 200 MHz, resonance data acquisition at 50 MHz is obtained. In the example, the lesser isolation figure of merit for the 50 MHz port does not substantially degrade utility of the coil (inasmuch as it is not often required to apply decoupling radiation at 50 MHz while acquiring data 200 MHz).

In order to obtain efficiency data for the subject double-tuned coil, 90° pulse lengths were measured for both protons (200 MHz) and $C^{13}$ (50 MHz) for both single and double-tuned cases. The additional power consumed from the double-tuned case is compared to the single tuned case in achieving a 90° nutation, and the loss is attributable to the double-tuned character of the coil whereby a figure of relative efficiency may be stated. These data are summarized below:

Proton resonance @ Power=50 watts
  Single-tuned 90° Pulsewidth=96 $\mu$sec
  Double-tuned 90° Pulsewidth=109 $\mu$sec
$C^{13}$ resonance @ Power=150 watts
  Single-tuned 90°=230 $\mu$sec
  Double-tuned 90°=240 $\mu$sec These data demonstrate 88% and 96% efficiency respectively at 200 and at 50 MHz.

Figure 7:
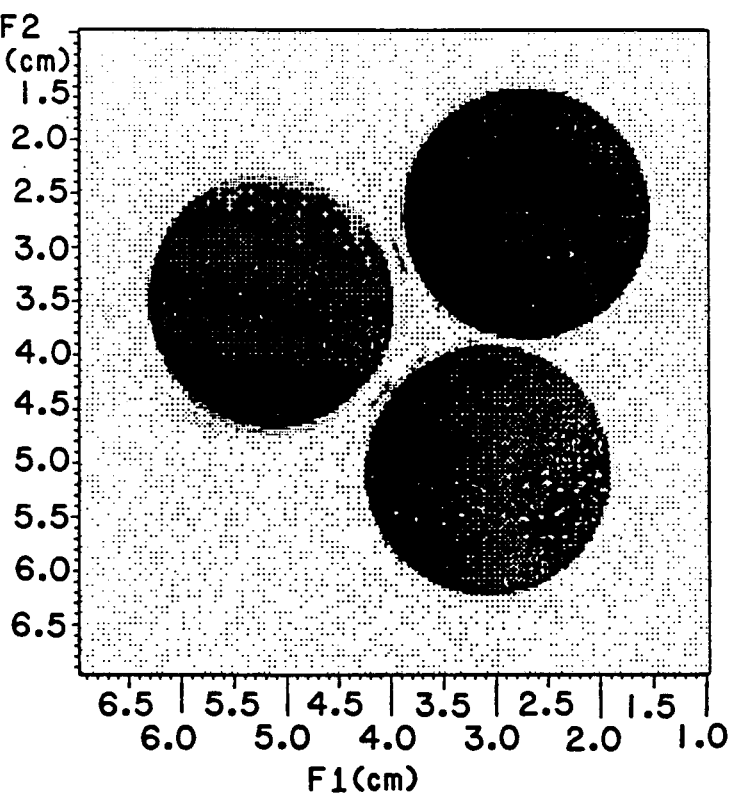
FIG. 7 shows the proton image of a three part test phantom with the coil of FIG. 5.

The above working model coil was further tested for imaging capabilities with a phantom comprising three glass vials filled with, respectively, benzene, ethylene glycol and acetone. In FIG. 7a there is shown a proton image of the three component phantom. In FIGS. 8a–d, there is obtained, without retuning, the $C^{13}$ spectrum of the same phantom.

FIG. 8a is a decoupled spectrum of the phantom showing peaks for benzene, glycol and acetone. In FIG. 8b there is shown a coupled spectrum corresponding to FIG. 8a and FIGS. 8c, 8d, 8e are the (spatially discriminated) spectra content of the three component vials of the phantom. In order to obtain the spatially discriminate spectrum, a stimulated echo localization sequence was employed.

Figure 9B:
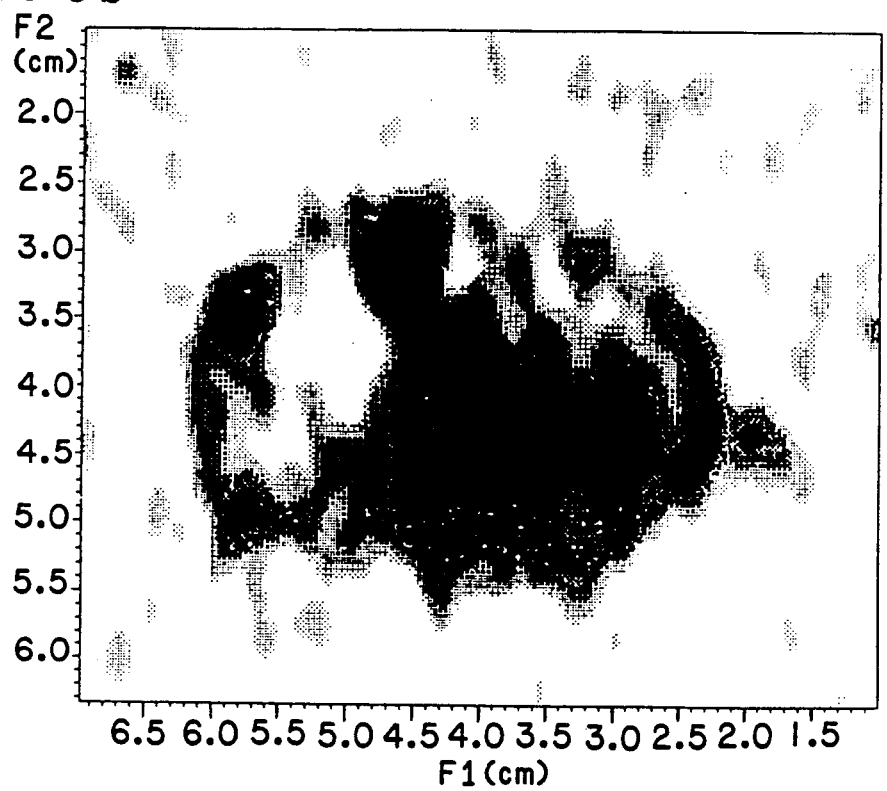

The low frequency port of the test coil was adaptable to tuning to resonance at 53 MHz for the purpose of acquiring $Na^{23}$ data. FIGS. 9a and b are proton and sodium images sequentially obtained from a section of a sedated rate. The image slice encompasses the liver and the $Na^{23}$ image shows an adema therein. These were obtained from separate excitations without re-tuning.

Figure 10:
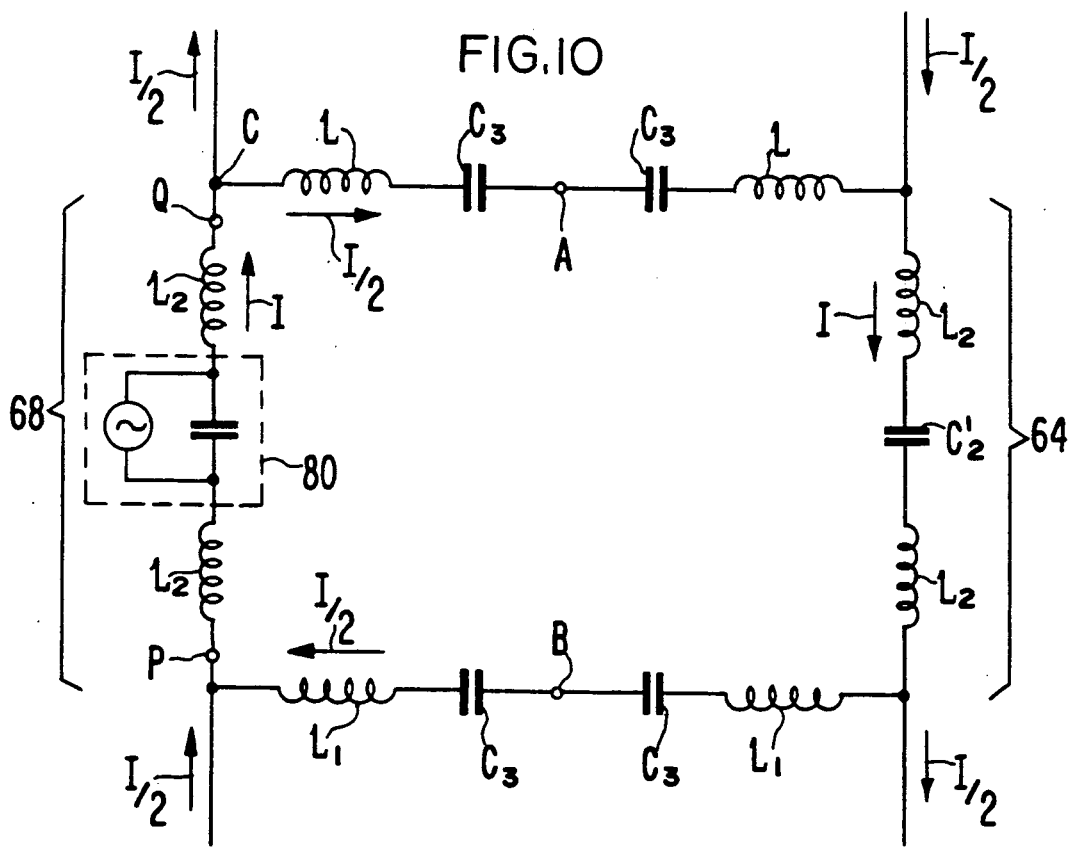
FIG. 10 is a schematic of a portion of the circuit of FIG. 3 and FIG. 5.

The above discussion indicates that the RF signal is to be applied in balanced fashion across the intermediately disposed capacitive element 74 (or 72) of the leg portion 68 (or 62) respectively. Turning now to FIG. 10, there is shown a subcircuit or portion of the circuit of FIGS. 3 and 5. One observes that the potential at point A is $$P_A = P_c - (Z_{L1} \cdot I/2) - (Z_3 \cdot I/2)$$

and that the potential at point B is $$P_B = P_c - (3Z_{L1} \cdot I/2) - (3Z_{c3} \cdot I/2) - (2Z_{L2} \cdot I) - (Z_{c2}' \cdot I)$$

where the potential $P_c$ is applied at point C. $P_B$ may be re-expressed as $$P_B = P_c - (Z_{L1} \cdot I/2) - (Z_{c3} \cdot I/2) - [2Z_{L2} + Z_{L1} + Z_{c3} + Z_{c2}'] \cdot I$$

However, the bracketed quantity vanishes (by equation 3) with the result that $P_A = P_B$. The requirement for zero potential at symmetric points is thus removed. The potential difference between these symmetrically disposed points on the loop will vanish if the condition of equation 3 is met for the loop. Thus, the leg portion 58 (or 62) may be driven anywhere on the leg and a balanced coupling of the signal source to the leg is not a requirement. That is, the RF source and tuning capacitor $C_2$ combination (80) may be inserted alternatively at positions P or Q instead of at the balanced location on leg 68.

It should also be recognized that the invention may be realized with either lumped, or distributed resitances, or both.

While there have been shown, described and pointed out the fundamental novel features as applied to a preferred embodiment, it will be understood that various omissions and substitutions in form and details of the device illustrated and in its operation may be made by those skilled in the art without departing from the spirit of the invention. It is intended, therefore, to be limited only as indicated by the scope of the following claims.

What is claimed is:

1. A double resonant segmented coil circuit comprising:
   (a) a pair of spaced-apart closed loop portions, each loop portion comprising four loop link members, each loop link member comprising an inductive loop element in series relationship with a capacitive loop element, four said loop link members joined in pairs in series relationship to form each said closed loop portion, said closed loop portion thereby comprising four function points,
   (b) four leg portions each disposed electrically to join respective loop link members of said closed loop portions at corresponding junction points, each said leg portion comprising two inductive leg elements and a capacitive leg element electrically disposed in series relationship therebetween said inductive leg elements,
   (c) a first driven leg comprising a first leg portion adapted to receive a first AC signal in parallel across the capacitive leg element thereof, and a second driven leg portion comprising a second leg portion adapted to receive a second AC signal in parallel across the capacitive leg element of said second leg portion through second AC coupling means,
   values of said inductive loop elements, inductive leg elements, capacitive loop elements, and capacitive leg elements selected whereby the potential difference between the nearest junction point of a loop portion symmetrically disposed to either side of said first driven leg portion due to said first AC signal vanishes and whereby the potential difference between the nearest junction points of symmetrically disposed to either side of said second driven leg portion due to said second AC signal vanishes.

2. The double resonant segmented coil circuit of claim 1 wherein said first RF signal is applied in parallel across the capacitive element of said first leg portion.

3. A double resonant segmented coil circuit comprising:
   (a) a pair of spaced-apart closed loop portions, each loop portion comprising four loop link members, each loop link member comprising an inductive loop element in series relationship with a capacitive loop element, four said loop link members joined in pairs in series relationship to form each said closed loop portion, said closed loop portion thereby comprising four junction points,
   (b) four leg portions each disposed electrically to join respective loop link members of said closed loop portions at corresponding junction points, each said leg portion comprising three leg elements said leg elements comprising two inductive leg elements and a capacitive leg element electrically disposed in series relationship therebetween said inductive leg elements,
   (c) a first driven leg comprising one leg portion of said first pair or leg portion adapted to receive a first Rf signal in parallel across at least one of the leg elements thereof, and a second driven leg comprising one leg portion of said second pair of leg portions adapted to receive a second RF signal in parallel across at least one of the leg element of said one leg portion of said second pair of leg portion through second AC coupling means,
   (d) A first pair of nonadjacent said leg portion characterized by capacitive leg elements of impedance $C_2$ 40 and the second pair of non-adjacent leg elements characterized by capacitive leg elements of impedance $C_3'$,
   values of said inductive loop elements, inductive leg elements, capacitive loop elements, and capacitive leg elements selected whereby the potential difference between the nearest junction points of a loop portion symmetrically disposed to either side of said first driven leg due to said first RF signal vanishes and whereby the potential difference between the nearest junction points symmetrically disposed to either side of said second driven leg portion due to said second RF signal vanishes.

* * * * *